(12) United States Patent
Huang et al.

(10) Patent No.: US 7,592,039 B2
(45) Date of Patent: Sep. 22, 2009

(54) METHOD FOR PRODUCING NANOTUBE MATERIAL AND NANOTUBE MATERIAL

(75) Inventors: Jian-guo Huang, Wako (JP); Toyoki Kunitake, Wako (JP)

(73) Assignee: Riken, Wako-Shi (JP)

( * ) Notice: Subject to any disclaimer, the term of this patent is extended or adjusted under 35 U.S.C. 154(b) by 131 days.

(21) Appl. No.: 10/558,305

(22) PCT Filed: Mar. 17, 2004

(86) PCT No.: PCT/JP2004/003570

§ 371 (c)(1),
(2), (4) Date: Mar. 22, 2007

(87) PCT Pub. No.: WO2004/106231

PCT Pub. Date: Dec. 9, 2004

(65) Prior Publication Data

US 2008/0038492 A1    Feb. 14, 2008

(30) Foreign Application Priority Data

May 29, 2003 (JP) ............................. 2003-153015
Jan. 9, 2004 (JP) ............................. 2004-004072

(51) Int. Cl.
*B05D 7/22* (2006.01)
*B32B 5/16* (2006.01)

(52) U.S. Cl. ................. 427/181; 427/190; 427/191; 427/195

(58) Field of Classification Search ............... 427/181, 427/190, 195, 191
See application file for complete search history.

(56) References Cited

U.S. PATENT DOCUMENTS

| 6,537,517 | B1* | 3/2003 | Kasuga et al. ........... 423/610 |
| 2005/0170089 | A1* | 8/2005 | Lashmore et al. ....... 427/248.1 |
| 2006/0032329 | A1* | 2/2006 | Rubinstein et al. ......... 75/255 |

FOREIGN PATENT DOCUMENTS

| JP | 9-241008 A | 9/1997 |
| JP | 10-152323 A | 6/1998 |
| JP | 2000-327310 | 11/2000 |
| JP | 2000-327310 A | 11/2000 |
| JP | 2002-338211 A | 11/2002 |

(Continued)

OTHER PUBLICATIONS

Lakshmi et al, Sol-Gel Template Synthesis of Semiconductor Nanostructures, Chem. Mater., 1997, 9 (3), 857-862.*

(Continued)

*Primary Examiner*—H. (Holly) T Le
(74) *Attorney, Agent, or Firm*—Birch, Stewart, Kolasch & Birch, LLP

(57) ABSTRACT

There are provided a method capable of mass-producing a nanotube material easily with low costs, and a nanotube material. The method of the present invention for producing a nanotube material has at least forming a metal oxide thin film or an organic/metal oxide composite thin film on an inner wall of a porous substrate and removing the porous substrate. The nanotube material of the invention has a structure provided from a body comprising a metal oxide thin film or an organic/metal oxide composite thin film formed on an inner wall of the porous substrate, from which a portion corresponding to the porous substrate is removed.

8 Claims, 10 Drawing Sheets

FOREIGN PATENT DOCUMENTS

| | | | |
|---|---|---|---|
| JP | 2003-313011 | A | 11/2003 |
| JP | 2004-75511 | A | 3/2004 |
| JP | 2004-130171 | A | 4/2004 |

OTHER PUBLICATIONS

Wang, Z. et al., Highly ordered zinc oxide nanotubules synthesized within the anodic aluminum oxide template, Applied Physics A: Materials Science & Processing, 2002. 0274 (2), pp. 201-203. ISSN: 0947-8396.

Wang et al., Highly ordered zinc oxide nanotubules synthesized within the anodic aluminum oxide template, Appl. Phys. A Materials Science & Processing, vol. 74, No. 2, 2002, pp. 201-203.

* cited by examiner

METHOD FOR PRODUCING NANOTUBE MATERIAL AND NANOTUBE MATERIAL

TECHNICAL FIELD

The present invention relates to a method for producing a nanotube material comprising a metal oxide thin film or an organic/metal oxide composite thin film, or the thin film and a polymer thin film, and a nanotube material. More particularly the invention relates to a method capable of mass-producing a nanotube material have a metal oxide thin film or an organic/metal oxide composite thin film easily with low costs by using a porous substrate as a template, and a nanotube material.

BACKGROUND ART

Metal oxides or organic/metal oxide composites having nanotube structures have physical and chemical properties different from those of corresponding bulk materials, and thereby have attracted much attention in both of basic and applied researches. Particularly hollow nanotube materials composed of the metal oxides and the organic/metal oxide composites are expected to be utilized in various fields of inclusion chemistry, electrochemistry, material, biomedicine, sensor, catalytic action, separation technology, etc.

Methods of producing metal oxide nanotube materials using carbon nanotubes as template has been reported (e.g. Ajayan, P. M, et al., "Carbon nanotubes as removable templates for metal oxide nanocomposition and nanostructures", Nature, 1995, 375, pp 564-567). In the method, a powder mixture of a partially oxidized carbon nanotube and a metal oxide is heated in the air at a temperature equal to or more than the melting point of the oxide to coat an inner wall of the tube with a metal oxide thin film, and then the carbon nanotube is removed by an appropriate treatment, whereby a layered metal oxide nanotube material can be obtained. Nanotubes using oxides of vanadium, silicon, aluminum, molybdenum, ruthenium, and zirconium have been produced by the method.

However, the metal oxide nanotube materials synthesized by the above method contain carbon or another impurity. The impurity can be a major obstacle in above application of the materials. While a method capable of mass-producing a composite nanotube easily with low costs has not been reported.

As described above, a method capable of easily mass-producing a nanotube material containing a metal oxide or an organic/metal oxide composite at a high purity with low costs has not been achieved. Accordingly, an object of the present invention is to provide a method capable of mass-producing a nanotube material with low costs and a composite nanotube material.

DISCLOSURE OF THE INVENTION

The inventors has found that a nanotube material, which has been produced by complicated, costly treatments so far, can be produced under mild conditions with low costs by using a low-cost, easily-available template material that can be completely removed under predetermined conditions. The present invention has been accomplished by the finding.

Thus, in the invention, the above object can be achieved by the following method of producing a nanotube material.

(1) A method for producing a nanotube material, comprising at least forming a metal oxide thin film or an organic/metal oxide composite thin film on an inner wall of a porous substrate and removing the porous substrate.

(2) A method for producing a nanotube material, comprising at least forming a metal oxide thin film or an organic/metal oxide composite thin film on an inner wall of a porous substrate, removing the porous substrate, and fixing an organic compound and/or a metal nanoparticle to the metal oxide thin film or the organic/metal oxide composite thin film.

(3) A method for producing a nanotube material, comprising at least forming a polymer thin film on an inner wall of a porous substrate, forming a metal oxide thin film or an organic/metal oxide composite thin film on the formed thin film, and removing the porous substrate.

(4) A method for producing a nanotube material, comprising at least forming a polymer thin film on an inner wall of a porous substrate, forming a metal oxide thin film or an organic/metal oxide composite thin film on the formed thin film, removing the porous substrate, and fixing an organic compound and/or a metal nanoparticle to the surface of the formed thin film.

(5) The method according to (3) or (4), wherein the step of forming the polymer thin film and/or the step of forming the metal oxide thin film or the organic/metal oxide composite thin film are repeated at least once.

(6) The method according to (3) or (4), wherein the step of forming the polymer thin film and the step of forming the metal oxide thin film or the organic/metal oxide composite thin film are carried out alternately.

(7) The method according to (3) or (4), wherein the polymer thin film and an organic compound contained in the organic/metal oxide composite thin film, or only the polymer thin film is removed simultaneously with or after the step of removing the porous substrate.

(8) The method according to any one of (1) or (7), wherein the step of forming the metal oxide thin film or the organic/metal oxide composite thin film comprises (a) a process of bringing a metal compound or combination of (the metal compound+ an organic compound) into contact with a surface that the thin film is to be formed on, the metal compound having a group capable of undergoing a condensation reaction with a reactive group present on or introduced to the surface and then being hydrolyzed to generate a hydroxyl group, and (b) a process of hydrolyzing the metal compound or the combination of (the metal compound+an organic compound) present on the surface, to form the metal oxide thin film or the organic/metal oxide composite thin film.

(9) The method according to (8), wherein the processes of (a) and (b) are carried out a plurality of times using plural types of metal compounds or combinations of (the metal compound+an organic compound).

(10) The method according to any one of (1) to (9), wherein the porous substrate, the polymer thin film, and/or the organic compound contained in the organic/metal oxide composite thin film are removed by at least one treatment selected from oxygen plasma treatments, ozone oxidation treatments, burning treatments, and dissolution treatments.

(11) The method according to (10), wherein the porous substrate is removed by a burning or dissolution treatment.

(12) The method according to (10) or (11), wherein the polymer thin film and the organic compound contained in the organic/metal oxide composite thin film are removed by an oxygen plasma treatment.

In the producing method of the invention, the metal oxide thin film or the organic/metal oxide composite thin film is formed on at least the inner wall of the porous substrate, and then the porous substrate is removed, whereby the nanotube material comprising the metal oxide thin film or the organic/metal oxide composite thin film using the porous substrate as a template can be easily produced with high purity. Further, in the producing method of the invention, the metal oxide thin film or the organic/metal oxide composite thin film is formed by a sol-gel method, whereby the nanotube material having the nanometer-level thin film can be produced under mild conditions.

Further, in the invention, the above object can be achieved also by the following nanotube material.

(1) A nanotube material having a structure provided from a body comprising a metal oxide thin film or an organic/metal oxide composite thin film formed on an inner wall of a porous substrate, from which a portion corresponding to the porous substrate is removed.

(2) A nanotube material having a structure that an organic compound and/or a metal nanoparticle is fixed to a body comprising a metal oxide thin film or an organic/metal oxide composite thin film formed on an inner wall of a porous substrate, from which a portion corresponding to the porous substrate is removed.

(3) A nanotube material having a structure provided from a body comprising a polymer thin film and a metal oxide thin film or an organic/metal oxide composite thin film formed in this order on an inner wall of a porous substrate, from which a portion corresponding to the porous substrate is removed.

(4) A nanotube material having a structure provided from a body comprising a porous substrate, and a polymer thin film and a metal oxide thin film or an organic/metal oxide composite thin film formed in this order on an inner wall of a porous substrate, from which a portion corresponding to the porous substrate and the polymer thin film, or the porous substrate, the polymer thin film, and an organic compound contained in the organic/metal oxide composite thin film is removed.

(5) A nanotube material having a structure that an organic compound and/or a metal nanoparticle is fixed to a body comprising a polymer thin film and a metal oxide thin film or an organic/metal oxide composite thin film formed in this order on an inner wall of a porous substrate, from which a portion corresponding to the porous substrate and the polymer thin film, or the porous substrate, the polymer thin film, and an organic compound contained in the organic/metal oxide composite thin film is removed.

(6) The nanotube material according to any one of (1) to (5), wherein the nanotube material has a shape formed using the porous substrate as a template.

(7) The nanotube material according to any one of (1) to (6), wherein the portion is removed by at least one treatment selected from oxygen plasma treatments, ozone oxidation treatments, burning treatments, and dissolution treatments.

(8) A nanotube material obtained by the producing method of the invention.

(9) The nanotube material according to any one of (1) to (8), wherein the nanotube material has self-supportability.

The structure of the nanotube material of the invention is such that the portion corresponding to the porous substrate is removed from the body, which comprises the metal oxide thin film or the organic/metal oxide composite thin film and optionally also comprises a polymer thin film on the inner wall of a porous substrate, so that nanoparticles of the polymer or the metal oxide are regularly arranged in a certain direction in the nanotube material. Further, in the nanotube material of the invention, an organic compound or a metal nanoparticle may be fixed to the metal oxide thin film, etc., whereby the resultant nanotube material can have different physical and chemical properties from those formed of only the metal oxide thin film.

In the producing method of the invention, the porous substrate can be completely removed with ease from the metal oxide thin film, the organic/metal oxide composite thin film, or the films and a polymer thin film, formed on at least the inner wall of the porous substrate, whereby the nanotube material comprising the metal oxide thin film or the organic/metal oxide composite having high purity can be easily obtained. Further, in the producing method of the invention, the metal oxide thin film or the organic/metal oxide composite thin film is formed by a sol-gel method, whereby the nanotube material having the nanometer-level thin film of the metal oxide or the organic/metal oxide composite can be produced under mild conditions.

Further, the structure of the nanotube material of the invention is such that the portion corresponding to the porous substrate is removed from the body, which comprises the metal oxide thin film or the organic/metal oxide composite thin film (or the polymer thin film) on the inner wall of the porous substrate, so that there can be provided a self-supportable composite nanotube comprising metal oxide nanoparticles arranged regularly in a certain direction. Further the nanotube material of the invention can contain the high-purity metal oxide, thereby resulting in excellent physical and chemical properties. Furthermore, the organic compound and/or the metal nanoparticle can be fixed to the thin film in the nanotube material of the invention, whereby the nanotube material can have physical and chemical properties different from those of the material for the thin film.

BEST MODE FOR CARRYING OUT THE INVENTION

Figure 1:
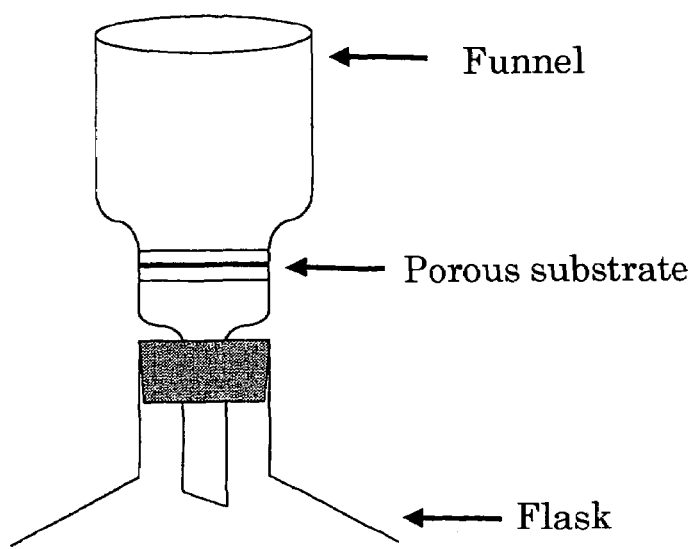
FIG. 1 is a schematic cross-sectional view for illustrating a vacuum filtration apparatus for the producing method of the present invention.

The method of the present invention for producing a nanotube material and the nanotube material of the invention are described below.

It should be noted that, in this description, the term "numeric value to numeric value" means a range including both the numeric values as the minimum value and maximum value. Further, in this description, the term "a nanotube material" means a closed or partially opened, hollow, tube-shaped material having a nanometer-level thickness, and includes nanotube aggregates comprising a plurality of tubes in addition to single nanotubes.

Further, in this description, the term "chemical adsorption" means formation of a chemical bond (such as a covalent bond, a hydrogen bond, and a coordinate bond) or an electrostatic bond (such as an ionic bond) between a reactive group on a porous substrate surface, a polymer thin film surface, or a metal oxide thin film surface, and a metal compound, a polymer, or a combination of (a metal compound+an organic compound).

Method for Producing Nanotube Material

In the producing method of the invention, at least a polymer thin film, a metal oxide thin film, or an organic/metal oxide composite thin film is formed on an inner wall of a porous substrate.

The porous substrate used for the producing method of the invention is not particularly limited as long as it has a plurality of internal pores (through-holes) and can be removed by a treatment to be hereinafter described. It is preferred from the viewpoint of achieving excellent adsorption of a polymer, a metal compound, or a combination of (a metal compound+an organic compound) to the inner wall that the porous substrate has a reactive group (preferably a hydroxyl or carboyl group) capable of condensation-reacting with the polymer, the metal compound, or the combination of (the metal compound+the organic compound). Examples of the porous substrates used for the invention include organic materials such as filter papers, cloths, yarns, cotton yarns, fabrics, fibers, wood chips, bamboo materials, and polycarbonate films, and inorganic porous materials such as aluminas, silicon, porous glasses, glass fiber films, and zeolite thin films.

There are no particular restrictions on the size, shape, etc. of the porous substrate for the producing method of the invention. In the producing method of the invention, the polymer, the metal compound, or the combination of (the metal compound+the organic compound) is brought into contact with the inner wall of the porous substrate, whereby the porous substrate does not have to comprise a flat surface, and may be appropriately selected from substrates having various materials and sizes. For example, the porous substrate may have various shapes of fiber, bead, powder, flake, etc., and may have a large area like a wall.

In the producing method of the invention, when the porous substrate have no reactive groups on the inner wall of the porous substrate (preferably the inner wall and the outer surface of the porous substrate), a reactive group (preferably a hydroxyl or carboxyl group) may be introduced to the inner wall of the porous substrate (preferably the inner wall and the outer surface) to use the porous substrate in the invention. The reactive group may be introduced to the inner wall and the surface of the porous substrate by a known reactive group introducing method.

The amount of the reactive group (preferably a hydroxyl or carboxyl group), which is present or introduced on the inner wall of the porous substrate, per unit area affects on the density of the polymer thin film, the metal compound thin film, or the organic/metal oxide composite thin film. For example, to form an excellent polymer thin film, metal oxide thin film, or organic/metal oxide composite thin film, the amount of the hydroxyl group is appropriately $5.0 \times 10^{13}$ to $5.0 \times 10^{14}$ equivalent/cm$^2$, preferably $1.0 \times 10^{14}$ to $2.0 \times 10^{14}$ equivalent/cm$^2$.

In the producing method of the invention, a polymer compound is used in the step of forming the polymer thin film. It is preferred that the polymer compound has a plurality of reactive groups (preferably hydroxyl or carboxyl groups) from the viewpoint of strongly adsorbing to the porous substrate, though not restrictive. The polymer compound may be in the state of solid or liquid at room temperature (25° C.). Examples of the polymer compounds in such a state at room temperature include polyvinyl alcohols, polyvinyl phenols, polyacrylic acids, polymethacrylic acids, poly(2-hydroxyethyl methacrylate)s, polyglutamic acids, polyserines, amyloses, colominic acids, etc.

Also cationic polymer compounds can be preferably used as the polymer compound. Metal alkoxides and metal oxides can interact like anions with cations of the cationic polymer compounds, resulting in strong adsorption. Specific examples of the cationic polymer compounds preferred in the invention include PDDAs (polydimethyldiallylammonium chlorides), polyethyleneimines, polylysines, chitosans, amino-ended dendrimers, etc.

In the invention, in the case of forming the polymer thin film, the polymer compound may be dissolved in an appropriate solvent and used as a solution. The solvent for dissolving the polymer compound may be appropriately determined depending on the type of the polymer compound to be dissolved. Examples of the solvents include methanol, ethanol, propanol, toluene, carbon tetrachloride, chloroform, cyclohexane, benzene, acetone, and DMF, which may be used singly or as a mixture thereof. Further, the solution containing the polymer compound preferably has a concentration of about 0.1 to 10 mg/ml.

There are no particular restrictions on the method of forming the polymer thin film. Examples of the methods include methods of soaking the porous substrate in a solution in which the polymer compound is dissolved an appropriate solvent to make the solution penetrate into pores of the porous substrate, methods of coating the porous substrate with the solution, and methods of soaking the porous substrate in the solution to fill the pores with the solution, which is aspirated under reduced pressure through the pores. The polymer compound is preferably brought into contact with the inner wall while aspirating the solution containing the polymer compound under reduced pressure to uniformly adsorb the polymer compound to the inner wall with ease.

The amount of the reactive group (preferably a hydroxyl or carboxyl group) adapted to be present on the polymer thin film surface affects on the density of the metal oxide thin film or the organic/metal oxide composite thin film, which is formed thereafter. To form an excellent metal oxide thin film or organic/metal oxide composite thin film, the amount of the reactive group is generally $5.0 \times 10^{13}$ to $5.0 \times 10^{14}$ equivalent/$cm^2$, preferably $1.0 \times 10^{14}$ to $2.0 \times 10^{14}$ equivalent/$cm^2$.

In the producing method of the invention, the metal compound used in the step of forming the metal oxide thin film or the organic/metal oxide composite thin film is not particularly limited as long as it can form the metal oxide thin film or the organic/metal oxide composite thin film on the inner wall of the porous substrate. The metal compound preferably has a known reactive group that can be condensation-reacted with the reactive group (preferably a hydroxyl or carboxyl group) on the porous substrate surface or the polymer thin film-formed surface and hydrolyzed to generate a hydroxyl group.

Typical examples of the metal compounds include metal alkoxide compounds such as titanium tetrabutoxide (Ti(O-nBu)$_4$), zirconium tetrapropoxide (Zr(O-nPr)$_4$), zirconium tetrabutoxide (Zr(O-NBu)$_4$), aluminum tributoxide (Al(O-nBu)$_3$), niobium pentabutoxide (Nb(O-nBu)$_5$), silicon tetramethoxide (Si(O-Me)$_4$), boron tetraethoxide (B(O-Et)$_3$), tin tetrabutoxide (Sn(O-iPr)$_4$), and indium tri(methoxyethoxide) (In(O-Et-O-Me)$_3$); metal alkoxides having 2 or more alkoxyl groups such as methyltrimethoxysilane (MeSi(O-Me)$_3$) and diethyldiethoxysilane (Et$_2$Si(O-Et)$_2$); metal alkoxides having 2 or more alkoxyl groups with a ligand such as acetylacetone; rare earth metal alkoxides such as lanthanide triisopropoxide (Ln(O-iPr)$_3$) and yttrium isopropoxide (Y(O-iPr)$_3$); and double alkoxide compounds such as BaTi(OR)$_x$. Among them, titanium tetrabutoxide (Ti(O-nBu)$_4$), zirconium tetrabutoxide (Zr(O-nBu)$_4$), silicon tetramethoxide (Si(O-Me)$_4$), tin tetraisopropoxide (Sn(O-iPr)$_4$), tin tetrabutoxide (Sn(O-nBu)$_4$), and indium tri(methoxyethoxide) (In(O-Et-O-Me)$_3$) are preferred, and titanium tetrabutoxide (Ti(O-nBu)$_4$), zirconium tetrabutoxide (Zr(O-nBu)$_4$), silicon tetramethoxide (Si(O-Me)$_4$), tin tetraisopropoxide (Sn(O-iPr)$_4$), tin tetrabutoxide (Sn(O-nBu)$_4$), and indium tri(methoxyethoxide) (In(O-Et-O-Me)$_3$) are more preferred.

In addition to the above metal alkoxides, alkoxide sol or gel particles prepared by adding a small amount of water to the metal alkoxides to partially hydrolyze and condensate them, binuclear or cluster alkoxide compounds having a plurality of metal elements such as titanium butoxide tetramer (C$_4$H$_9$O[Ti(OC$_4$H$_9$)$_2$O]$_4$C$_4$H$_9$), and polymers based on metal alkoxide compounds one-dimensionally cross-linked via oxygen atoms can be used as the compound with the metal alkoxide group in the invention.

The metal compounds used in the invention further include metal complexes that can be adsorbed to the reactive group on the porous substrate surface or the polymer thin film surface and can be hydrolyzed to generate another hydroxyl group on the surface. Specific examples of the metal complexes include metal halides such as cobalt chloride (CoCl$_2$), metal carbonyl compounds such as titanium oxcacetylacetate (TiO(CH$_3$COCH$_2$COO)$_2$) and pentacarbonyl iron (Fe(CO)$_5$), and multinuclear clusters thereof.

The above metal compounds may be used in combination of two or more of them. By combining different metal compounds, a composite metal compound layer can be formed on the inner wall of the porous substrate or the polymer thin film. Examples of the combined metal compounds include combinations of indium methoxyethoxide (In(O-Et-O-Me)$_3$) and tin tetraisopropoxide (Sn(O-iPr)$_4$), aluminum tributoxide (Al(O-nBu)$_3$) and tin tetraisopropoxide (Sn(O-iPr)$_4$), and titanium tetrabutoxide (Ti(O-nBu)$_4$) and lanthanide triisopropoxide (Ln(O-iPr)$_3$).

The organic compound used in the step of forming the organic/metal oxide composite thin film in the producing method of the invention is not particularly limited, and it is preferred that the organic compound has a plurality of reactive groups (preferably hydroxyl or carboxyl groups) and is solid at room temperature (25° C.) to be strongly absorbed to the porous substrate surface or the polymer thin film surface together with the metal compound. The organic compound may be the above polymer compound or a low-molecular compound. Preferred examples of the organic compounds include polymer compounds having a hydroxyl or carboxyl group such as polyacrylic acids, polyvinyl alcohols, polyvinyl phenols, polymethacrylic acids, and polyglutamic acids; polysaccharides such as starchs, glycogens, and colominic acids; disaccharides and monosaccharides such as glucose and mannose; and porphyrin compounds and dendrimers having an end of a hydroxyl or carboxyl group.

Also the above-mentioned cationic polymer compounds can be preferably used as the organic compound. Metal alkoxides and metal oxides can interact like anions with cations of the cationic polymer compounds, resulting in strong adsorption.

These organic compounds can act not only as a structural component for forming a thin film with high mechanical strength, but also can act as a functional component for introducing a function to the resultant thin film material or as a template component that is removed after the film formation to form pores corresponding to the molecular shape in the thin film.

In the step of forming the metal oxide thin film or the organic/metal oxide composite thin film, the above metal oxide or combination of (the metal oxide+the organic compound) may be dissolved in an appropriate solvent. The solvent for dissolving the metal compound or combination of (the metal compound+the organic compound) is not particularly limited, and for example, methanol, ethanol, toluene, propanol, benzene, etc. may be used singly or as a mixture thereof. Further, the concentration of the metal compound or combination of (the metal compound+the organic compound) is about 1 to 200 mM, preferably 50 to 150 mM, more preferably 50 to 100 mM. When the concentration of the metal compound (+ the organic compound) is 1 to 200 mM, the metal oxide thin film or the organic/metal oxide composite thin film can be uniformly formed.

The method for bringing the metal compound or the combination of (the metal compound+the organic compound) into contact with the inner wall of the porous substrate or the polymer thin film is not particularly limited, and may be a known method. Examples of the methods include methods of soaking the porous substrate or the porous substrate on which a polymer thin film is formed in a solution of the metal compound or the combination of (the metal compound+the organic compound) dissolved in an appropriate solvent to achieve the contact with the porous substrate inner wall surface or the polymer thin film surface, methods of coating the porous substrate or the polymer thin film surface with the solution, and methods of soaking the porous substrate or the porous substrate on which a polymer thin film is formed in the solution to fill the pores with the solution, and aspirating the solution under reduced pressure through the pores. From the viewpoint of achieving uniform contact (adsorption) with ease of the metal compound or the combination of (the metal compound+the organic compound) to the porous substrate inner wall or the polymer thin film surface, it is preferred that the solution containing the metal compound or the combination of (the metal compound+the organic compound) is aspirated under reduced pressure to bring them into contact with each other (adsorption).

The contact time and the contact temperature depend on the characteristics of the metal compound or the combination of (the metal compound+the organic compound) and thereby it cannot clearly be limited, and generally the contact time may be 1 minute to several hours and the contact temperature may be 0 to 100° C. Further, in a chemical reaction for forming the metal oxide thin film or the organic/metal oxide composite thin film, a catalyst such as an acid and a base may be used to largely reduce the time required fop the step.

After the above processes, a saturated adsorption amount of the polymer compound, the metal compound, and/or the combination of (the metal compound+the organic compound), and further physically adsorbed components of the polymer compound, the metal compound, and/or the combination of (the metal compound+the organic compound) exist on the porous substrate inner wall or the polymer thin film. To obtain the uniform and even polymer thin film, the metal oxide thin film, or the organic/metal oxide composite thin film, excess part of the metal compound or the combination of (the metal compound+the organic compound) physically absorbed to the thin film has to be removed in some cases.

The method of removing the excess part of the polymer compound, the metal compound, or the combination of (the metal compound+the organic compound) is not particularly limited as long as it can remove the polymer compound, the metal compound, or the combination of (the metal compound+the organic compound) selectively. Preferred examples of the methods include washing with the above solvent. Preferred methods for the washing include methods of soaking the substrate in the solvent and then aspirating under reduced pressure to remove the excess polymer compound, etc. together with the solvent, methods of soaking and washing the substrate in the solvent, spray washing methods, steam washing methods, etc. Further, the washing temperature is preferably equal to the temperature in the adsorption process.

In the producing method of the invention, after removing the above excess part of the polymer compound, the metal compound, and/or the combination of (the metal compound+ the organic compound), the metal compound on the formed surface is hydrolyzed. The metal compound is condensed by the hydrolyzation, so that the metal oxide thin film or the organic/metal oxide composite thin film is formed on the surface. The hydrolyzation may be carried out using a known method without particular restrictions. For example, the most common hydrolyzation process is such that water is introduced to the porous substrate inner wall, which the metal compound or the combination of (the metal compound+the organic compound) is brought into contact with. In view of preventing the penetration of impurities, etc. and forming the metal oxide thin film or the organic/metal oxide composite thin film with high purity, ion-exchange water is preferably used for the hydrolyzation. A catalyst such as an acid and a base may be used to largely shorten the hydrolyzation time required for the steps. The hydrolyzation may be carried out such that the metal compound or the combination of (the metal compound+the organic compound) is brought into contact with the porous substrate inner wall or the polymer thin film and then soaked in an organic solvent and a small amount of water. Further, in a case where the metal compound has a high reactivity with water, it may be reacted with water vapor in the air to be hydrolyzed. After the hydrolyzation, the porous substrate inner wall is dried by a drying gas such as nitrogen gas if necessary. The uniform metal oxide thin film or organic/metal oxide composite thin film can be obtained by the process.

In the producing method of the invention, the metal oxide thin film or the organic/metal oxide composite thin film having a uniform thickness can be formed on the porous substrate inner wall or the polymer thin film by repeating the processes of the contact and hydrolyzation at least once, preferably 5 times or more, more preferably 10 times or more, further preferably 20 times or more. Further, the above processes may be carried out a plurality of times using a plurality of types of the metal oxide or the combination of (the metal compound+the organic compound).

In the producing method of the invention, the thickness of the metal oxide thin film or the organic/metal oxide composite thin film may be controlled by repeating the operations of the chemical adsorption of the metal compound or the combination of (the metal compound+the organic compound), the removal of the excess adsorbed components, and the hydrolyzation.

Further, in the producing method of the invention, the step of forming the polymer thin film and the step of forming the metal oxide thin film or the organic/metal oxide composite thin film may be repeated alternately. The polymer thin film and the metal compound thin film or organic/metal oxide composite thin film are formed alternately in the nanotube material by this process.

By the above operations, the metal oxide thin film or the organic/metal oxide composite thin film can be formed on the porous substrate inner wall or the polymer thin film. In the case of using the above compound having a plurality of hydroxyl or carboxyl groups as the metal compound or the organic compound, a hydroxyl group can be disposed on the thin film even after forming the thin film. Thus, in this case, the hydroxyl group present on the thin film can be used for forming another metal oxide thin film or organic/metal oxide composite thin film by the above operations. It is also possible to further form a metal oxide thin film or organic/metal oxide composite thin film thereon, so that a multilayer structure of the metal oxide thin films and/or organic/metal oxide composite thin films having various types and thicknesses at nano level can be formed by repeating the operations.

In the producing method of the invention, by repeating the processes, the metal oxide thin film or organic/metal oxide composite thin film of several nanometers to several tens nanometers (specifically 2 to 100 nm, preferably 5 to 50 nm, more preferably 10 to 30 nm) can be formed on the porous substrate inner wall or the polymer thin film with excellent accuracy. In the case of using a metal alkoxide having one metal atom such as titanium butoxide for forming the metal oxide thin film or the organic/metal oxide composite thin film thin films having thicknesses of several tens nanometers can be successively stacked depending on the adsorption conditions. In this case, the thickness increase per 1 cycle corresponds to adsorption of one monomolecular layer of the metal alkoxide. On the other hand, in the case of using alkoxide gel microparticles, etc., a thin film having a thickness of about 60 nm can be stacked in 1 cycle. Further, in the case of using polyacrylic acid as the organic compound, a thin film having a thickness of one to several tens nanometers can be formed depending on the contact conditions. In the invention, by the extent of the successive stacking of the metal oxide thin film and/or the organic/metal oxide composite thin film, the thin film with the above thickness accuracy can be appropriately produced.

Further, by changing the kind of the metal compound or the organic compound in this process, a composite thin film stack with a hybrid layer structure can be obtained.

The producing method of the invention comprises removing the porous substrate from the body having the polymer thin film, the metal oxide thin film, or the organic/metal oxide composite thin film formed on the porous substrate inner wall in the above manner. The nanotube material using the porous substrate as template is produced by removing the porous substrate from the body.

The producing method of the invention may further comprise removing the polymer thin film or both of the polymer thin film and an organic compound contained in the organic/metal oxide composite thin film after removing the porous substrate. An amorphous metal oxide thin film can be formed by removing the polymer thin film and/or the organic compound in the organic/metal oxide composite thin film from the nanotube material.

The porous substrate, and the polymer thin film and/or the organic compound contained in the organic/metal oxide composite thin film may be removed by a oxygen plasma treatment, an ozone oxidation treatment, a burning treatment, or an dissolution treatment alone, or a combination thereof. Preferred among the above treatments are the burning treatment and the oxygen plasma treatment capable of removing at a low temperature while controlling the removing depth. Further, in the invention, it is also preferred that a solvent is appropriately selected to selectively dissolve and remove the porous substrate, the polymer thin film, or the organic compound contained in the organic/metal oxide composite thin film.

The method of the above treatments such as the oxygen plasma, ozone oxidation, burning, and dissolution treatments may be appropriately selected depending on the properties such as solubility and melting point of the metal compound, the organic compound, and the polymer used in the invention. For example, the time, pressure, output, and temperature of the oxygen plasma treatment may be appropriately selected depending on the plasma source, the types and sizes of the porous substrate, the polymer compound, and the metal compound and organic compound in the metal oxide thin film and the organic/metal oxide composite thin film, etc.

Specifically, it is appropriate that the pressure of the oxygen plasma treatment is 1.33 to 66.5 Pa (10 to 500 mTorr), preferably 13.3 to 26.6 Pa (100 to 200 mTorr). The plasma output of the oxygen plasma treatment is appropriately 5 to 500 W, preferably 10 to 50 W. The treatment time of the oxygen plasma treatment is appropriately 5 minutes to several hours, preferably 5 to 60 minutes. Further, the temperature of the oxygen plasma treatment is a low temperature, preferably −30 to 300° C., more preferably 0 to 100° C., most preferably room temperature (5 to 40° C.).

A plasma apparatus for use in the oxygen plasma treatment is not particularly limited, and for example may be PE-2000 plasma etcher manufactured by South Bay Technology, USA, etc.

For example, it is preferred that the burning treatment is carried out in atmosphere at a temperature of 100 to 1200° C., preferably 400 to 500° C., at a heating rate of 1 to 20° C./minute, preferably 1 to 5° C./minute, for a time of 30 seconds to 6 hours, preferably 10 minutes to 2 hours.

The conditions of the ozone oxidation treatment may be appropriately selected depending on properties of the porous substrate, the polymer thin film, and the organic compound in the organic/metal oxide composite thin film, and an apparatus for the treatment. For example, it is appropriate that the pressure of the ozone oxidation treatment is atmospheric pressure to 13.3 Pa (100 mTorr), preferably 0.013 to 13.3 Pa (0.1 to 100 mTorr). The time of the ozone oxidation treatment may be several minutes to several hours, preferably 5 to 60 minutes. The treatment temperature may be room temperature to 600° C., preferably room temperature to 400° C.

The method of the dissolution may be appropriately selected from known ones depending on the types of the components in the porous substrate, the polymer thin film, and the organic/metal oxide composite thin film. For example, when the porous substrate is composed of an alumina material, the porous substrate can be selectively dissolved by using an alkali solvent.

In the producing method of the invention, an organic compound and/or a metal nanoparticle may be fixed to the thin film formed by removing the porous substrate and the polymer thin film, or the porous substrate and the polymer thin film and/or the organic compound in the organic/metal oxide composite thin film. In the case of fixing the organic compound and/or the metal nanoparticle to the formed thin film, the resultant thin film can have different physical or chemical properties.

In this description, the term "fixing" means a state where the thin film holds the organic compound and/or the metal nanoparticle due to a physical or chemical action, and the organic compound and/or the metal nanoparticle may be not only disposed on the surface of the thin film, but also embedded inside the thin film.

The organic compound and the metal nanoparticle are not particularly limited as long as they can be fixed to the thin film to be formed. Examples of the organic compounds include latex particles. Further, the metal nanoparticle may be a nanoparticle of gold, silver, copper, platinum, palladium, iron, lead, etc., and is preferably a gold nanoparticle, a silver nanoparticle, or a platinum nanoparticle. The organic compound and the metal nanoparticle may have various shapes, and may be in a grain shape, a film shape, a corrugated shape, etc.

The organic compound and the metal nanoparticle may be fixed to the outer surface, the inner surface, or the inside of the tubular metal oxide thin film and organic/metal oxide composite thin film. In the case of fixing to the inner surface of the thin film, the resultant formed body can have the organic compound and/or the metal nanoparticle on the open shell of the tubular metal oxide thin film or organic/metal oxide composite thin film. Further, in the case of the metal oxide thin film having such a structure that the organic compound is removed from the organic/metal oxide composite thin film, the organic compound and/or the metal nanoparticle can be embedded in portions at which the organic compound is removed from the thin film.

The method for fixing the organic compound and/or the metal nanoparticle is not particularly limited, and may be selected from various fixing methods such as methods of soaking the formed thin film in a liquid prepared by dispersing an organic compound and/or a metal ion-containing compound in an appropriate solvent, and methods of soaking the thin film in the liquid and then aspirating the liquid under reduced pressure. Also methods of directly fixing dispersed metal nanoparticles to the thin film may be used. In the case of fixing the metal nano particles, a metal ion-containing compound may be fixed to the thin film and them reduced to form the metal nanoparticle. Known reducing agents may be used in the reduction.

The metal ion-containing compound for fixing the metal nanoparticle may be appropriately selected depending on the metal nanoparticle to be fixed. Examples of such metal ion-containing compounds include first row transition metal salts such as chromium nitrate ($Cr(NO_3)_3$), manganese nitrate ($Mn(NO_3)_2$), iron nitrate ($Fe(NO_3)_3$, and cobalt nitrate ($CO(NO_3)_2$), second row transition metal salts such as palladium nitrate ($Pd(NO_3)_2$), silver nitrate ($AgNO_3$), and cadmium nitrate ($Cd(NO_3)_2$), lanthanoid metal salts such as lanthanum nitrate ($La(NO_3)_3$) and gadolinium nitrate ($Gd(NO_3)_3$), alkaline earth metal salts such as barium nitrate ($Ba(NO_3)_2$) and calcium nitrate ($Ca(NO_3)_2$), alkaline metal salts such as potassium nitrate ($KNO_3$) and lithium nitrate ($LiNO_3$), etc. Also metal chlorides such as gold trichloride ($AuCl_3$), platinum chloride ($PtCl_3$), platinum (II) chloride ($PtCl_4$), and palladium chloride ($PdCl_3$) can be preferably used. Further, a counter anion of the cation in water is not particularly restricted. Examples thereof include a dilute solution of sodium hydroxide (NaOH). Also a metal complex compound such as $[Cu(NH_3)_4]^{2+}$, $[Fe(NH_3)_6]^{3+}$, and $[Co(NH_3)_4]^{2+}$ may be used in the producing method of the invention. Further, also a metal compound such as $AuCl_3$, capable of coordinating with the organic material may be used as the metal ion-containing compound in the producing method of the invention. The metal ion-containing compounds may be used in combination of two or more if necessary. By using different metal ions in combination, a thin film carrying composite metal nanoparticles can be obtained.

The solvent for dissolving the metal ion-containing compound is not particularly limited as long as the metal ion-containing compound (such as a metal salt and a metal complex compound) can be dissolved therein to generate a metal ion, a metal complex, or a coordinating metal compound. For example, the solvent may be water, toluene, THF, methanol, ethanol, chloroform, hexane, DMP, or DMSO alone, or a combination thereof.

The concentration of the metal ion-containing compound affects the average particle diameter and dispersion property of the metal nanoparticle, and thereby it may be appropriately selected depending on the desired particle diameter of the metal nanoparticle. The concentration of the metal ion-containing compound is preferably within the range of 1 to 100 mM, more preferably about 10 mM.

A reducing agent for reducing the metal ion-containing compound is not particularly limited, and may be a known one. Examples of the reducing agents used in the invention include sodium borohydride ($NaBH_4$), potassium borohydride ($KBH_4$), lithium aluminum hydride ($LiAlH_3$), alcohols such as glycol, ethanol, propanol, and isopropanol, hydrogen iodide (HT), and secondary or tertiary amine compounds such as hydroxylamine, hydrazine compounds, dimethylaminoethanol, and dimethylethylamine. Among them, it is preferred that sodium borohydride ($NaBH_4$) and hydrogen iodide (HI) are used as the reducing agent. Alternately, the metal ion-containing compound may be reduced by a treatment in a reducing atmosphere of hydrogen, carbon monoxide, etc., hydrogen plasma, or light irradiation. The concentration of the reducing agent, the strength of the hydrogen plasma, the type of the light source, the light intensity, the reduction time, the reduction temperature, etc. may be those of known reduction methods.

In the reduction reaction in the solution, a basic compound such as sodium hydroxide and ammonium hydroxide, a pH adjuster such as an inorganic or organic acid, an oxycarbonic acid such as sodium citrate and sodium acetate, a buffer agent such as boron, an inorganic acid of carbonic acid, etc., an organic acid, and an inorganic acid alkali salt, an accelerating agent such as a sulfide and a fluoride, a stabilizer such as a chloride, a sulfide, and a nitrate, a modifier such as a surfactant, etc., may be added to the reaction system. Also in the method of heat treatment in the reducing atmosphere, an inert gas such as nitrogen, argon, and helium may be used in combination.

Nanotube Material of the Invention

The structure of the nanotube material of the invention is such that the portion corresponding to the porous substrate, or the porous substrate and the polymer thin film and/or organic compound in the organic/metal oxide composite thin film is removed from a body comprising the metal oxide thin film or organic/metal oxide composite thin film, or the polymer thin film and the metal oxide thin film or organic/metal oxide composite thin film formed in this order on at least the porous substrate inner wall.

The structure formed by removing the portion corresponding to the porous substrate or the organic compound contained in the organic/metal oxide composite thin film is such a structure comprising the metal oxide thin film or the organic/metal oxide composite thin film (or corresponding the metal oxide thin film in the case where the organic compound contained therein is completely removed) having spaces corresponding to the special position where the porous substrate or the organic compound contained in the composite thin film has been placed in. Thus, in the structure, the portion where the porous substrate or the organic compound has been placed may be correspondingly converted to the spaces, the vicinity around the portion where the porous substrate or the organic compound has been placed may be converted to the spaces, and a portion where the porous substrate or the organic compound has been placed or a vicinity thereof are converted into spaces and further, a part of the spaces are connected to each other to form a network structure. "The structure formed by removing the portion corresponding to the polymer thin film" is such that a structure in which the polymer thin film formed between the porous substrate and the metal oxide thin film or organic/metal oxide composite thin film is removed and the metal oxide thin film or organic/metal oxide composite thin film is disposed on the porous substrate.

Further, the structure of the nanotube material of the invention may be such that the portion corresponding to the porous substrate, or the porous substrate and the polymer thin film and/or organic compound in the organic/metal oxide composite thin film is removed from a body comprising the metal oxide thin film or organic/metal oxide composite thin film, or the polymer thin film and the metal oxide thin film or organic/metal oxide composite thin film formed in this order on at least the porous substrate inner wall, and the organic compound and/or the metal nanoparticle is fixed to the body.

The nanotube material of the invention is preferably produced by the manufacturing method of the invention. In the case of forming the polymer thin film, the thickness of each thin film in the nanotube material is 0.5 to 5.0 nm, preferably 0.5 to 2.0 nm. The thickness of the metal oxide thin film or the organic/metal oxide composite thin film depends on the number of repeating the step of forming the thin film, and is generally 2 to 50 nm, preferably 10 to 20 nm. In the case of fixing the organic compound and/or the metal nanoparticle to the thin film, the grain diameter of the organic compound is 20 to 500 nm, preferably 50 to 200 nm, when the organic compound is granular. The average particle diameter of the metal nanoparticle is preferably 1 to 100 nm, more preferably 1 to 50 nm, most preferably 1 to 20 nm. The number of the metal nanoparticles per a unit area 1 µm$^2$ on the thin film is 100 to $10^6$, preferably 500 to $10^6$, more preferably 3,000 to $10^6$.

The shape of the nanotube material is not particularly limited, and can conform the shape of the porous substrate used as the template. For example, the nanotube material of the invention may have a various shape of filter, cylinder, string, etc. When the nanotube material has a filter shape, the thickness thereof is 30 µm to 20 mm, preferably 50 µm to 0.5 mm. On the other hand, when the nanotube material has a cylinder shape, the outer diameter is 100 nm to 2 cm, preferably 100 to 250 nm.

The nanotube material of the invention has the metal oxide thin film comprising the metal oxide with excellent arrangement and/or the organic/metal oxide composite thin film comprising the organic compound and the metal oxide. The arrangement of the metal oxide or the metal oxide and organic compound is formed after the hydrolyze process, whereby a covalent bond network can be formed in the metal oxide or the metal oxide and organic compound. The covalent bond network structure of the metal oxide or the metal oxide and organic compound is maintained even after removing the porous substrate. Thus, the nanotube material of the invention has self-supportability due to the structure.

In this description, the term "self-supportability" means not only a property that the nanotube and the aggregate structure maintain its three-dimensional shape before and after removing the porous substrate but also a property that the nanotube and the aggregate structure are not assembled irreversibly and their surface areas are sufficiently larger than their thicknesses after removing the porous substrate.

EXAMPLES

The characteristics of the invention are described in more detail below with reference to examples.

Various changes may be made on materials, amounts, ratios, treatment details, treatment procedures, etc. in Examples without departing from the scope of the invention. Thus, the following specific examples should not be considered restrictive.

Example 1

A common filter paper (manufactured by Advantec) was attached to a vacuum filtration apparatus shown in FIG. 1, washed by vacuum filtration of 40 ml of ethanol, prior to the use and dried by air flow. 10 ml of a titanium butoxide (Ti (OBu)$_4$) solution (100-mM 1:1 toluene/ethanol solution) was slowly filtered over 3 minutes, the filter paper was washed by vacuum filtration of 20 ml of ethanol twice, titanium butoxide adsorbed to the filter paper was hydrolyzed and condensed by vacuum filtration of 20 ml of deionized water, and the resultant filter paper was dried by air flow. Each cellulose fiber in the filter paper was coated with a titania gel thin film in this manner. Then, the steps of filtration, washing, hydrolyzation, and drying were repeated 20 times, the resultant filter paper/titania composite was treated at 450° C. for 6 hours at a heating rate of 1° C./minute, and the filter paper used as template was burned and removed. As a result, a self-supportable titania nanotube material controlled at nanometer level was obtained. This sample had the shape and size of the original filter paper though slightly deformed by the burning treatment, and thus may be referred to as "titania paper".

For comparison, a filter paper not treated with the titanium butoxide solution was subjected to the above burning treatment. No components remained after the burning treatment.

A small piece of the obtained titania nanotube material was grinded and dispersed in ethanol by ultrasonic wave. One drop of the dispersion liquid was put on a silicon wafer for a scanning electron microscope and on a copper mesh covered with silicon oxide for a transmission electron microscope respectively, and dried in the air to produce samples for electron microscope observation.

Figure 2:
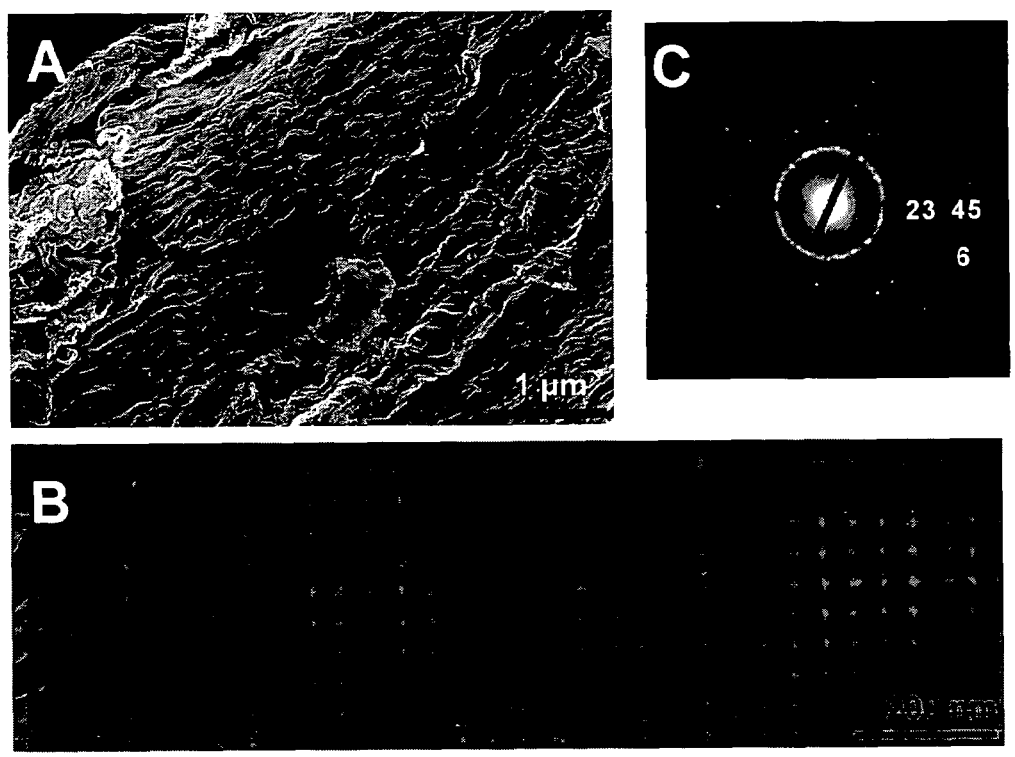
FIG. 2 shows a scanning electron microscope image (A), a transmission electron microscope image (B), and an electron beam diffraction image (C) of a titania nanotube material produced in Example 1.

A scanning electron microscope image of the obtained titania nanotube material is shown in FIG. 2A. The internal structure of the filter paper was faithfully reproduced in the titania layer, and it is clear that the "titania paper" comprises a titania tube material. The nanotube structure was clearly observed also by the transmission electron microscope, and the outer diameter of the nanotube material was within a range of 30 to 100 nm (FIG. 2B). Further, the wall thickness of the nanotube material was approximately 10 nm. The length of the nanotube material was estimated to be several tens micrometers through the length cannot be measured accurately, since the material was subjected to the ultrasonic wave treatment beforehand for observing using the electron microscopes.

Further, as a result of electron beam diffraction of the obtained titania nanotube material, a sharp diffraction ring specific to anatase type titanium oxide was observed (FIG. 2C). The ring 1-6 indexes correspond to the (101), (004), (200), (105+211), (204), and (116) faces of anatase respectively.

Example 2

A titania nanotube material was produced in the same manner as Example 1 except for using a cotton cloth instead of the filter paper of Example 1. The resultant cotton cloth/titania composite was subjected to a burning treatment to obtain a self-supportable titania nanotube material having the same shape as the original cotton cloth. This is a cloth-shaped nanotube material, which may be referred to as "titania cloth".

Figure 3:
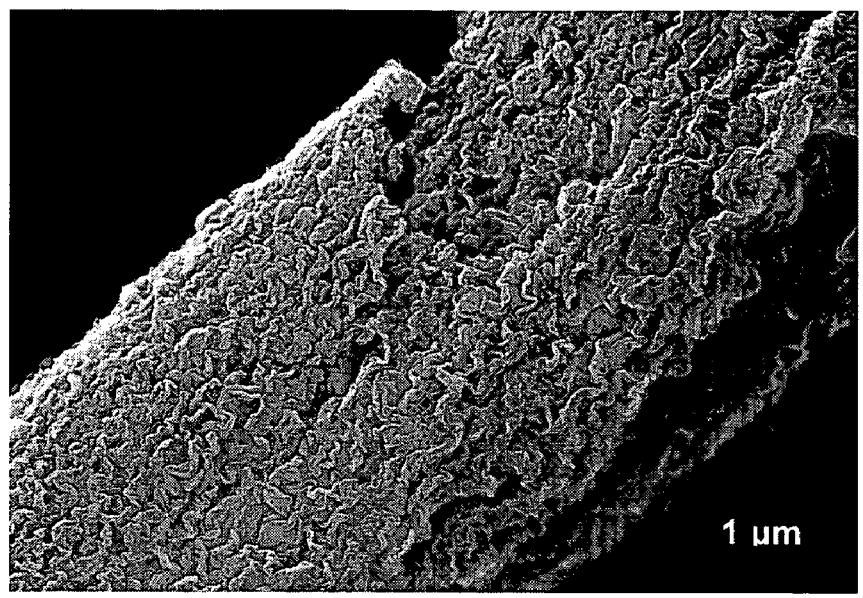
FIG. 3 is a scanning electron microscope image of a titania nanotube material produced in Example 2.

A scanning electron microscope image of the obtained titania nanotube material is shown in FIG. 3. The internal structure of the titania cloth was precisely reproduced in the titania. It was clear that the titania nanotube material had a uniform outer diameter of several tens nanometers, and the nanotubes were aggregated into a macro body.

Example 3

A titania nanotube material was produced in the same manner as Example 1 except for using a common absent cotton yarn as a template instead of the filter paper of Example 1. The resultant cotton yarn/titania composite was subjected to a burning treatment to obtain a self-supportable titania nanotube material. The titania nanotube material had the same size as the cotton yarn template, and thus may be referred to as "titania yarn".

Figure 4:
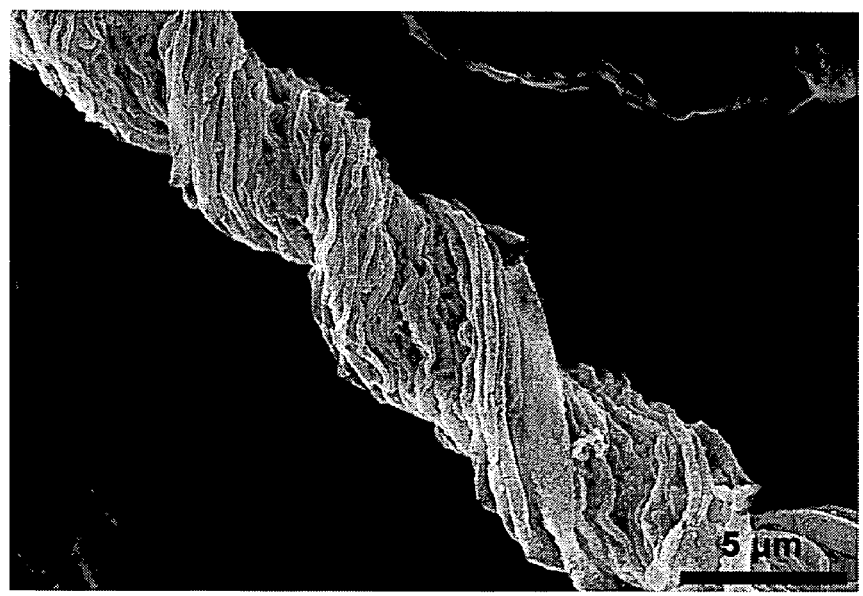
FIG. 4 is a scanning electron microscope image of a titania nanotube material produced in Example 3.

A scanning electron microscope image of the helical titania nanotube arrangement is shown in FIG. 4. The internal structure of the cotton yarn was carved in the titania layer, and the titania nanotube arrangement was clearly observed. The titania yarn had an outer diameter of several tens to several hundreds nanometers, and the nanotubes were aggregated into a macro fiber. The titania yarn had a length of several hundreds micrometers. As shown in FIG. 4, a helical nanotube arrangement, which was formed due to twisting of an aggregate of cellulose fibers in the cotton yarn template, was found in the scanning electron microscope image. It is clear from the results that the helical structure of the cotton fibers was transferred to the metal oxide nanotube.

Example 4

Figure 5:
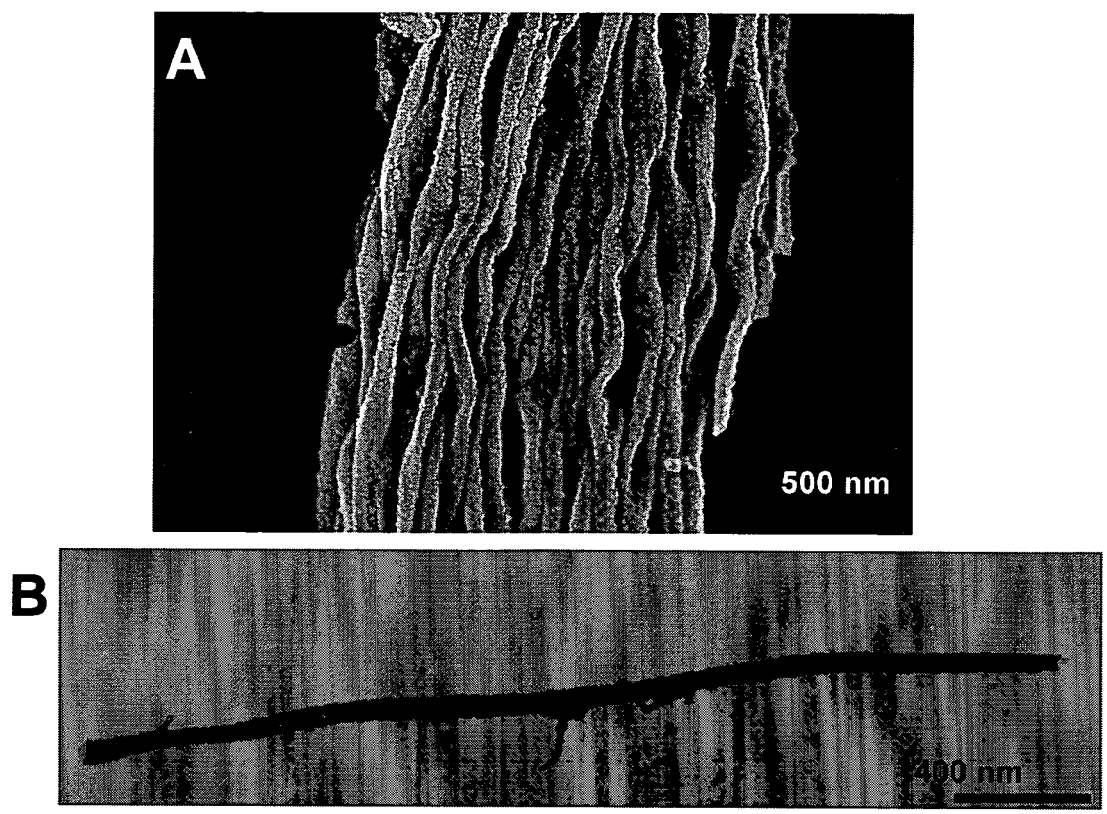
FIG. 5 shows a scanning electron microscope image (A) and a transmission electron microscope image (B) of a zirconia nanotube material produced in Example 4.

A zirconia nanotube material was produced in the same manner as Example 1 except for using zirconium butoxide ($Zr(O-nBu)_4$) as a compound having metal alkoxide groups. A self-supportable zirconia nanotube material having the same shape as the original filter paper was obtained after burning the filter paper/zirconia composite like Example 1. A scanning electron microscope image (FIG. 5A) and a transmission electron microscope image (FIG. 5B) of the zirconia nanotube material are shown in FIG. 5. As is clear from the scanning electron microscope image of FIG. 5A, the internal structure of the filter paper was faithfully reproduced in the zirconia layer, and regularly arranged zirconium nanotube material was formed. Further, as is clear from the transmission electron microscope image of one zirconia nanotube of FIG. 5B, the obtained zirconia nanotube had the same shape as the titania nanotube of Example 1.

Example 5

Figure 6:
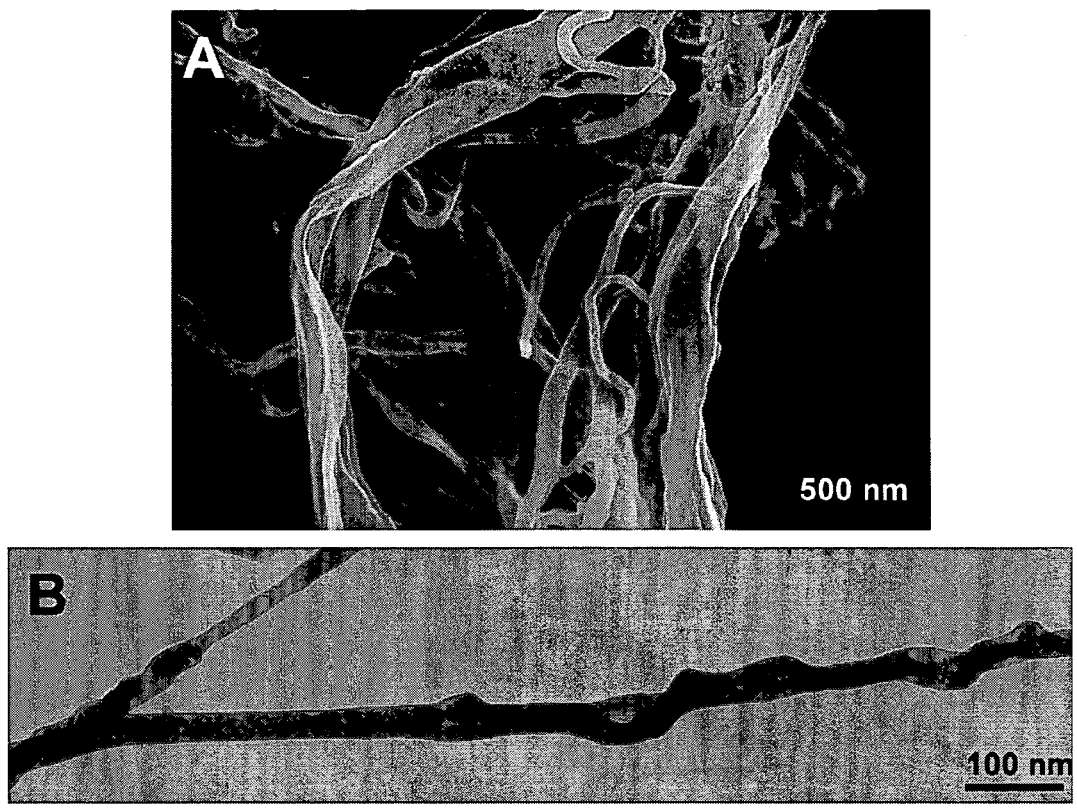
FIG. 6 shows a scanning electron microscope image (A) and a transmission electron microscope image (B) of a silica nanotube material produced in Example 5.

A silica nanotube material was produced in the same manner as Example 1 except for using silicon tetramethoxide ($Si(OMe)_4$) as a compound having metal alkoxide groups. The size of the silica nanotube material obtained by burning a filter paper/silica composite was reduced to about one third of the original size. A scanning electron microscope image (FIG. 6A) and a transmission electron microscope image (FIG. 6B) of the silica nanotube material are shown in FIG. 6. As is clear from the scanning electron microscope image (FIG. 6A), the obtained silica nanotube material has an internal structure reflecting that of the filter paper though the obtained silica nanotube material had a size smaller than that of the original filter paper and a random arrangement. Further, as is clear form the transmission electron microscope image of the silica nanotube material of FIG. 6B, the obtained silica nanotube was soft and had an outer diameter of several tens nanometers and a length of several to several tens micrometers.

Example 6

An alumina filtration film (Whatman Anodisc 25, UK) was attached to a vacuum filtration apparatus shown in FIG. 1, and washed by aspirating 40 ml of ethanol and air flow in this order therethrough. The concentrations of solutions used for stacking were as follows. Water used in the aqueous solutions was deionized water.
Polyethyleneimine (PEI) (average molecular weight: 10,000) 2 mg/ml aqueous solution
Polyacrylic acid (PAA) (average molecular weight: 12,500) 1 mg/ml (1:1 ethanol/water)
Titanium butoxide ($Ti(O-nBu)_4$) 100 mM (1:1 toluene/ethanol)
Polyvinyl alcohol (PVA) average molecular weight: 25,000) 5 mg/ml aqueous solution
20 ml of the PEI solution was put in a funnel, 10 ml of the solution was slowly vacuum-filtered, and the residual solution was maintained on the alumina filtration film for 30 minutes to sufficiently form a PEI layer on an inner wall of the alumina filtration film and then was slowly vacuum-filtered. Immediately 40 ml of water was aspirated through the alumina filtration film to remove the excess solution from the inner wall of the film, and air was aspirated therethrough to air-dry the film. The PEI layer was formed on the inner wall of the alumina filtration film in this manner. Then, a PAA layer was stacked on the PEI layer in the same manner to form a PEI/PAA bilayer. The PAA layer has a large number of carboxyl groups, on which a titania layer can be easily formed. Then, 20 ml of the titanium butoxide solution was added to the funnel, 10 ml of the solution was vacuum-filtered while reducing the pressure slowly. The residual solution was maintained in the funnel for 3 minutes to promote the formation of a titania layer and then was slowly vacuum-filtered, and immediately the alumina filtration film was washed with 20 ml of ethanol twice. Then, 20 ml of water was aspirated to promote hydrolyzation and condensation of titanium butoxide, and the film was dried by air flow. The inner wall of the resultant alumina filtration film was covered with a 3-layered structure of PEI/PAA/titania. A PVA layer was formed on the titania thin film in the same manner as the PEI layer, to provide a 4-layered structure of PEI/PAA/titania/PVA. Then, the steps of forming the titania layer and the PVA layer were repeated ten times to form a composite having a PEI/PAA/(titania/PVA)$_{10}$ thin film on the inner wall of the alumina filtration film.

Then, the obtained composite was soaked in a 6-M potassium hydroxide solution for 5 minutes to dissolve the alumina filtration film, whereby a tubular polymer/titania nanotube material was separated.

Figure 7:
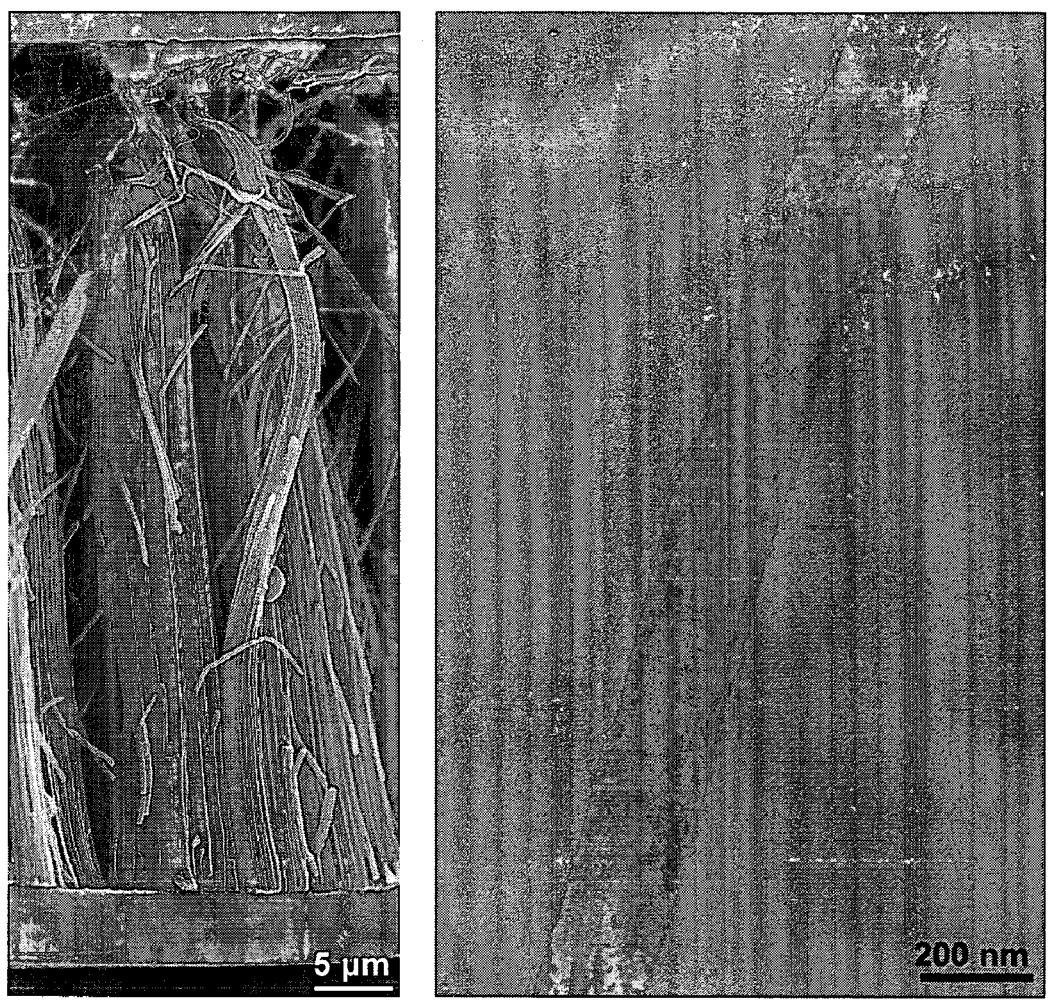
FIG. 7 shows a scanning electron microscope image (A) and a transmission electron microscope image (B) of a polymer/titania nanotube material produced in Example 6.

FIG. 7A is an outline of the self-supportable organic titania composite nanotube material observed by a scanning electron microscope. The nanotube wall is composed of one PEI layer, one PAA layer, and 10 titania PVA composite layers. It should be noted that the nanotube material is fixed by forming polystyrene layers above and below the material to support the observation.

As shown in FIG. 7A, a highly-arranged, dense, composite nanotube aggregate was observed, and it was clear that the original pore shape was maintained even after removing the alumina disk.

The shape of the composite nanotube material can be maintained even when the polystyrene layers are removed. Thus, the titania polymer composite film is formed also on the upper and lower surface of the alumina disk to cover the entire disk, whereby the composite nanotubes are aggregated and fixed by the film even after removing the alumina disk. The organic titania composite nanotube material had an wall thickness of approximately 15 nm and an outer diameter of approximately 200 nm. Further, the nanotube material had a length of 60 µm, which was equal to the thickness of the original alumina disk.

A transmission electron microgram of one organic titania composite tube separated from the organic titania composite nanotube material is shown in FIG. 7B. As shown in FIG. 7B, the nanotube was entirely uniform.

Example 7

A multilayer film of PEI/PAA/(titania/PVA)$_6$/titania was stacked on the surface and inner wall of an alumina filtration film in the same manner as Example 6. The organic titania composite nanotube material had a wall thickness of approximately 8 nm. The innermost wall of the composite nanotube material was composed of the titania layer.

Then, nanoparticles of a polystyrene latex (MICROMOD (trademark) GREEN F COOH, particle diameter 100 nm) were fixed to the inner wall of the composite nanotube material.

The used latex particles had surfaces modified with a carboxylic acid group, and the concentration of the dispersion liquid was 0.1 mg/ml. 20 ml of the aqueous latex dispersion liquid was added to the funnel, 10 ml thereof was slowly vacuum-filtered, and the residue was left for 30 minutes to promote the adsorption of the nanoparticles. Then, 10 ml of the residual liquid was slowly vacuum-filtered, and immediately the resultant was washed by vacuum-filtering 40 ml of water and dried by air flow. The alumina filtration film was dissolved in an alkali and removed to obtain a self-supportable organic titania composite nanotube material having the nanoparticles supported in the tubes.

Figure 8:
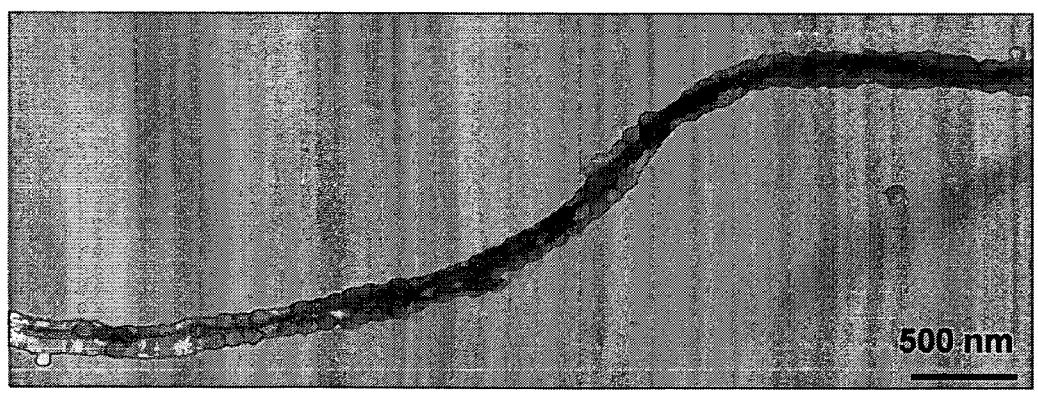
FIG. 8 is a transmission electron microscope image of a polymer/titania nanotube material containing latex particles produced in Example 7.

As a result of observing the obtained composite nanotube material using a scanning electron microscope, it was found that a large number of the latex particles were fixed to the entire inner surface of the template film. Further, as shown in the transmission electron microscope image of FIG. 8, the material had such a structure that the latex particles were fixed to the inner periphery of the composite nanotube.

Example 8

A composite nanotube material was produced in the same manner as Example 6 except for using a commercially available porous polycarbonate film instead of the alumina filtration film in Example 6.

The surface of the commercially available polycarbonate film manufactured by Whatman (pore diameter 30 nm) was subjected to an oxygen plasma treatment (185 mTorr, 30 W, 20 minutes; PE-2000 plasma etching apparatus (South Bay Technology, RF 13.56 MHz)) to increase the amount of surface carboxyl groups.

Then, a small piece of the polycarbonate film was placed on the vacuum filtration apparatus shown in FIG. 1, dried by aspirating air, and washed by vacuum-filtering 10 ml of ethanol. 5 ml of a $Ti(OBu)_4$ solution (100-mM 1:1 toluene/ethanol solution) was slowly filtered over 5 minutes, the polycarbonate film was washed by vacuum-filtering 5 ml of ethanol twice, 5 ml of deionized water was vacuum-filtered to promote hydrolyzation and condensation of titanium butoxide adsorbed to the polycarbonate film, and the resultant was dried by air flow. The inner wall of the polycarbonate film was covered with a titania gel thin film in this manner. Then, the steps of filtration, washing, hydrolyzation, and drying were repeated 15 times.

The obtained polycarbonate titania composite nanotube material was soaked in 1.0 ml of chloroform using an ultrasonic wave apparatus to dissolve and remove the polycarbonate film. Thus obtained white solid was centrifuged and washed with 1.0 ml of chloroform 3 times, and the obtained sample was dispersed in 0.5 ml of ethanol.

Figure 9:
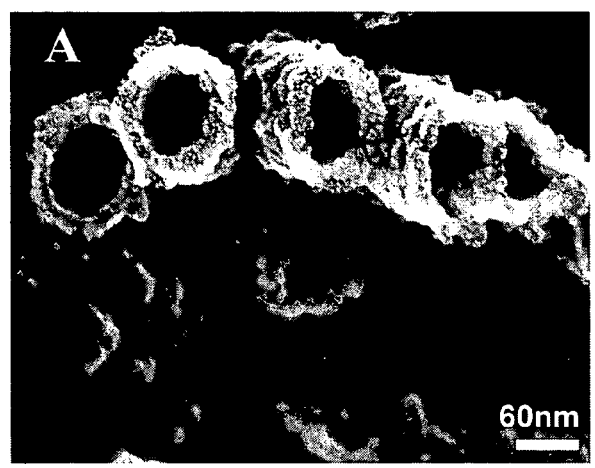
FIG. 9 shows a scanning electron microscope image (A) and a transmission electron microscope image (B) of a titania nanotube material produced in Example 8.

A scanning electron microscope image and a transmission electron microscope image of the obtained titania nanotube material are shown in FIGS. 9A and 9B respectively. As shown in each electron microscope image of FIG. 9, the obtained titania nanomaterial had a tubular structure. The obtained titania nanotube material was self-supportable and amorphous, and had an outer diameter of approximately 70 nm and a thickness of 15 nm.

Example 9

A polymer titania composite having a PEI/PAA/(titania/PVA)$_{10}$ thin film was formed on an inner wall of an alumina filtration film in the same manner as Example 6, and then was subjected to an oxygen plasma treatment to treat the composite material. The oxygen plasma treatment was carried out using PE-2000 plasma etching apparatus (South Bay Technology RF 13.56 MHz) at the room temperature under a pressure of 23.4 Pa (176 mTorr) at an output of 30 W for 20 minutes. The polymer component was removed by the oxygen plasma treatment to obtain a body having a titania layer on the inner wall of the alumina filtration film.

Figure 10:
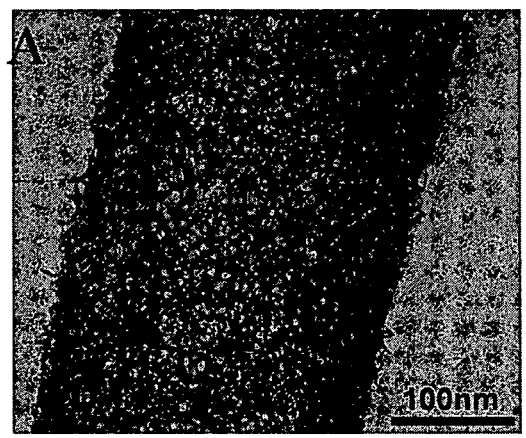
FIG. 10 shows a transmission electron microscope image (A) and a scanning electron microscope image (B) of a titania nanotube material produced in Example 9.
Figure 10:
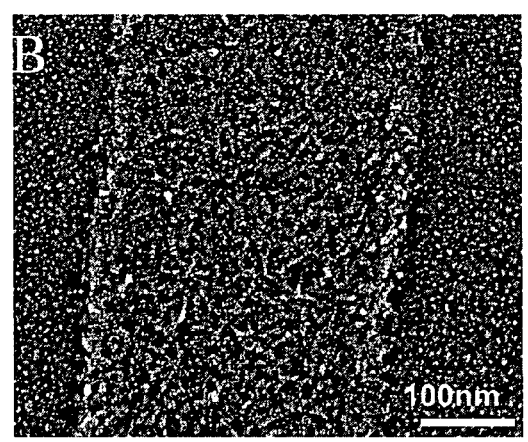

Then, this body was soaked in a 6 M KOH aqueous solution for 5 minutes to dissolve and remove the alumina filtration film. The obtained titania nanotube aggregate was dispersed in ethanol by an ultrasonic wave treatment to separate to independent titania nanotubes, and observed by a scanning electron microscope and a transmission electron microscope. The results are shown in FIG. 10.

As shown in FIG. 10A, the formed titania nanotube maintained a hollow tube structure, which was a nanoporous structure having irregular pores with diameters of 2 to 6 nm disposed irregularly. The titania tube had the structure remarkably different from that of the composite untreated with the oxygen plasma. Further, this nanoporous structure was found also on the outer surface of the titania nanotube (FIG. 10B). It is clear from this result that the titania nanotube material obtained in this Example was a highly nanoporous tube material.

Example 10

A nanotube material carrying gold nanoparticles was formed using a template of a body obtained by an oxygen plasma treatment in the same manner as Example 9.

The alumina filtration film/titania thin film obtained by an oxygen plasma treatment in the same manner as Example 9 was set to the vacuum filtration apparatus of FIG. 1, 10 ml of an iced 0.1 M $NaBH_4$ solution and 20 ml of pure water were vacuum-filtered in this order, and the resultant filter was air-dried. Then, 10 ml of a $2.5 \times 10^{-4}$ M $AuCl_4$ solution and 20 ml of pure water were vacuum-filtered in this order, and thus generated gold nanoparticles were embedded in pore walls of the titania thin film.

Figure 11:
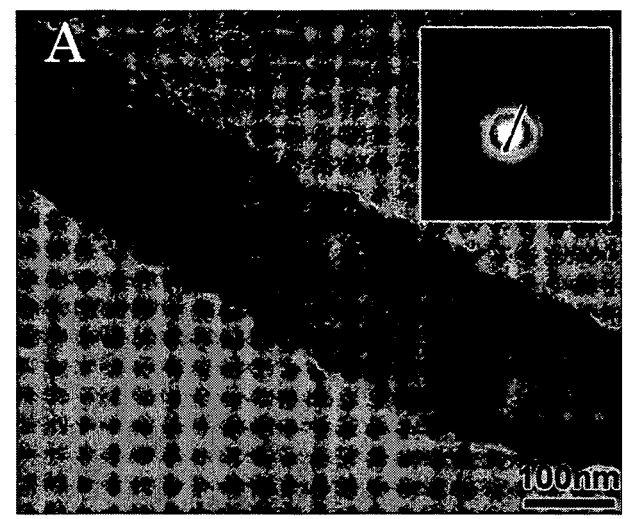
FIG. 11 shows transmission electron microscope images (A, B) and a gold nanoparticle size distribution (C) of a gold nanoparticle-embedded titania nanotube material produced in Example 10.
Figure 11:
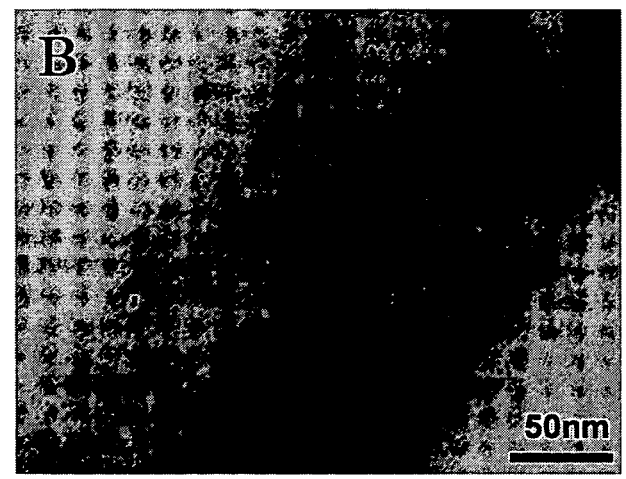
Figure 11:
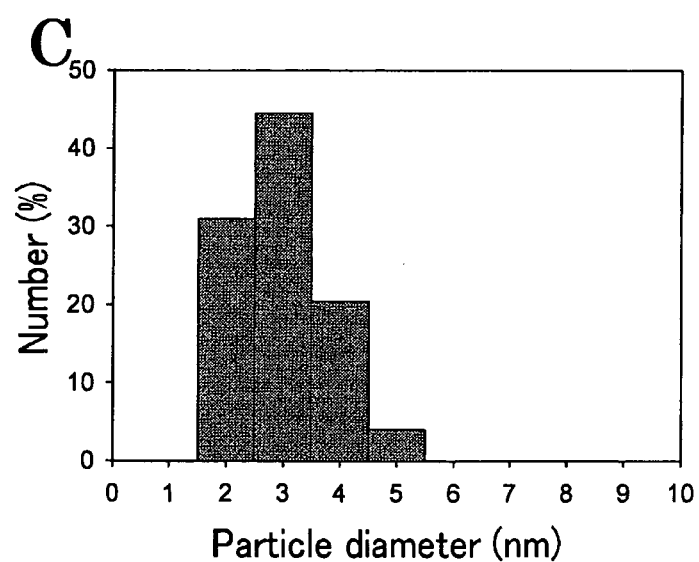

The alumina filtration film was dissolved from the body having the titania thin film, in which the gold nanoparticles were uniformly embedded, by an alkali treatment (soaking in a 6 M KOH aqueous solution for 5 minutes), to obtain a titania nanotube material in which the gold nanoparticles were uniformly embedded. The obtained nanotube material is shown in FIG. 11.

Black points in FIGS. 11A and 11B represent the gold nanoparticles, and it is clear that the nanoparticles existed highly densely in the titania thin film. It is clear from the selected area electron beam diffraction (SAED) shown in the upper right of FIG. 11A that the gold nanoparticles comprised gold nanocrystals. Further, as shown in FIG. 11C, the gold nanoparticles had the average particle diameter of 3.0 nm and the distribution standard deviation of 0.8 nm.

Example 11

A tin oxide nanotube material was produced using a filter paper as a template in the same manner as Example 1.

A common filter paper (manufactured by Advantec) was attached to a vacuum filtration apparatus shown in FIG. 1, washed by vacuum filtration of 40 ml of ethanol, and dried by air flow. Among 10 ml of a tin tetrabutoxide $(Sn(O-nBu)_4)$ solution (10 nM 1:1 isopropanol/methanol solution), 5 ml thereof was slowly filtered first, and 5 ml of the residual solution was added to the funnel and left for 5 minutes to form a thin film on cellulose fibers of the filter paper. Then, the solution on the filter paper was vacuum-filtered, and 20 ml of a 1:1 isopropanol/methanol solution was vacuum-filtered to wash the paper twice. 20 ml of ion-exchange water was added to the funnel, 10 ml of ion-exchange water was vacuum-filtered, and the resultant was left for 5 minutes to promote hydrolyzation and condensation of the metal alkoxide adsorbed to the filter paper, and at last, dried by air flow. The film formation steps of filtration, washing, hydrolyzation, and drying were repeated at 50° C. 12 times, and thus obtained filter paper thin oxide composite was heat-treated at 450° C. (heating rate 1° C./minute) or at 1100° C. (heating rate 3° C./minute) for 6 hours, to burn and remove the template of the filter paper.

Figure 12:
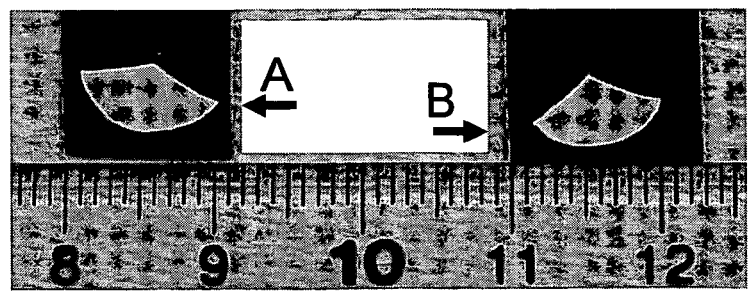
FIG. 12 shows optical micrograms of tin oxide filter papers produced at burning temperatures of 450° C. (A) and 1100° C. (B) respectively in Example 11.

As a result, as shown in FIG. 12, a tin oxide nanotube material (hereinafter referred to as "a tin oxide filter paper") using the macro-self-supportable filter paper as a template was obtained in each case of the burning temperatures of 450° C. (A) and 1100° C. (B). The shape and size of the tin oxide filter paper were substantially equal to those of the filter paper used as the template though the paper was slightly deformed. Further, the obtained tin oxide was amorphous.

A small piece of the obtained tin oxide filter paper was grinded and dispersed in ethanol by ultrasonic wave. One drop of the dispersion liquid was put on a silicon wafer for a scanning electron microscope or on a gold grid coated with silicon oxide when using a transmission electron microscope respectively, and dried by air flow to produce samples for electron microscope observation.

Figure 13:
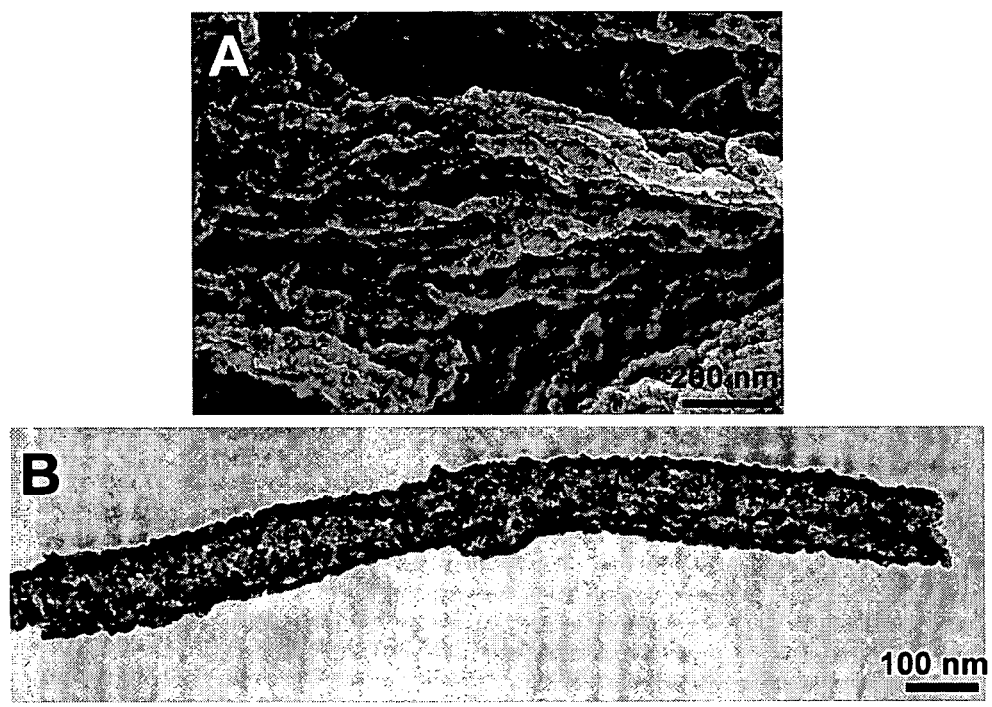
FIG. 13 shows a scanning electron microscope image (A) and a transmission electron microscope image (B) of the tin oxide filter paper produced using a filter paper as a template at the burning temperature of 450° C. in Example 11.

A scanning electron microscope image of the tin oxide filter paper obtained by burning at 450° C. is shown in FIG. 13A. As shown in FIG. 13A, the nanotube aggregate structure of the tin oxide filter paper was clearly observed, and the hierarchical structure of cellulose fibers in the filter paper was faithfully reproduced in the tin oxide filter paper. Further, the nanotube structure of the tin oxide filter paper was clearly observed also by the transmission electron microscope (TEM) as shown in FIG. 13B, each nanotube had an outer diameter of several tens to one hundred nanometers and a length corresponding to that of the original cellulose fiber. The nanotube had a wall thickness of about 10 to 15 nm.

Figure 14:
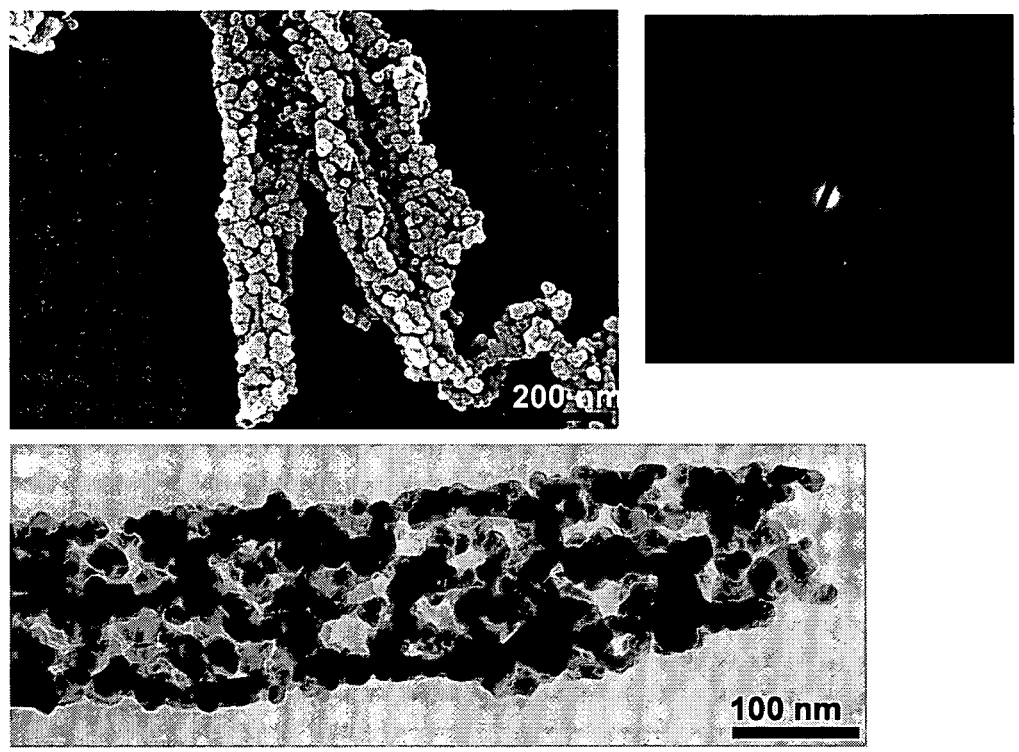
FIG. 14 shows a scanning electron microscope image (A), a transmission electron microscope image (B), and a selected area electron beam diffraction (SAED) image (C) of the tin oxide filter paper produced using a filter paper as a template at the burning temperature of 1100° C. in Example 11.

A scanning electron microscope image of the tin oxide filter paper obtained by burning at 1100° C. is shown in FIG. 14A. As shown in FIG. 14A, the nanotube aggregate structure of the tin oxide filter paper was clearly observed in this case of the burning temperature of 1100° C. as the case of 450° C. Further, the corresponding transmission electron microscope image is shown in FIG. 14B. It is clear from FIG. 14B that a nanotube structure connected via microparticles having sizes of approximately 10 nm was formed.

Further, a selected area electron beam diffraction (SAED) pattern of the obtained tin oxide filter paper is shown in FIG. 14C. It is clear from FIG. 14C that the selected area electron beam diffraction (SAED) pattern of the nanotube aggregate in the tin oxide filter paper had a series of sharp diffraction rings, and thus rutile type tin oxide was formed. Thus, tin oxide was crystallized by burning at the high temperature.

Example 12

An indium tin oxide (ITO) nanotube material (hereinafter referred to as "ITO filter paper") was produced using a filter paper as a template in the same manner as Example 11.

Figure 15:
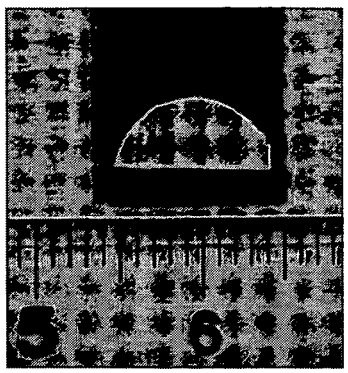
FIG. 15 is an optical microgram of an ITO filter paper produced in Example 12.

A precursor solution contained 4 mM of tin tetraisopropoxide (Sn(O-iPr)$_4$), 8 mM of indium methoxy ethoxide (In(OCH$_2$CH$_2$OCH$_3$)$_3$), and a mixed solvent of 1:1:2 isopropanol/methanol/methoxyethanol. The formation of the ITO thin film was repeated 12 times at 50° C. It was clear from QCM (quartz crystal microbalance) measurement that an amorphous ITO film with a thickness of approximately 0.5 nm was formed in 1 cycle. Further, the ITO filter paper obtained by burning the filter paper ITO composite at 450° C. at a heating rate of 1° C./minute for 6 hours was a pale yellow film having the shape of the filter paper as shown in FIG. 15.

Figure 16:
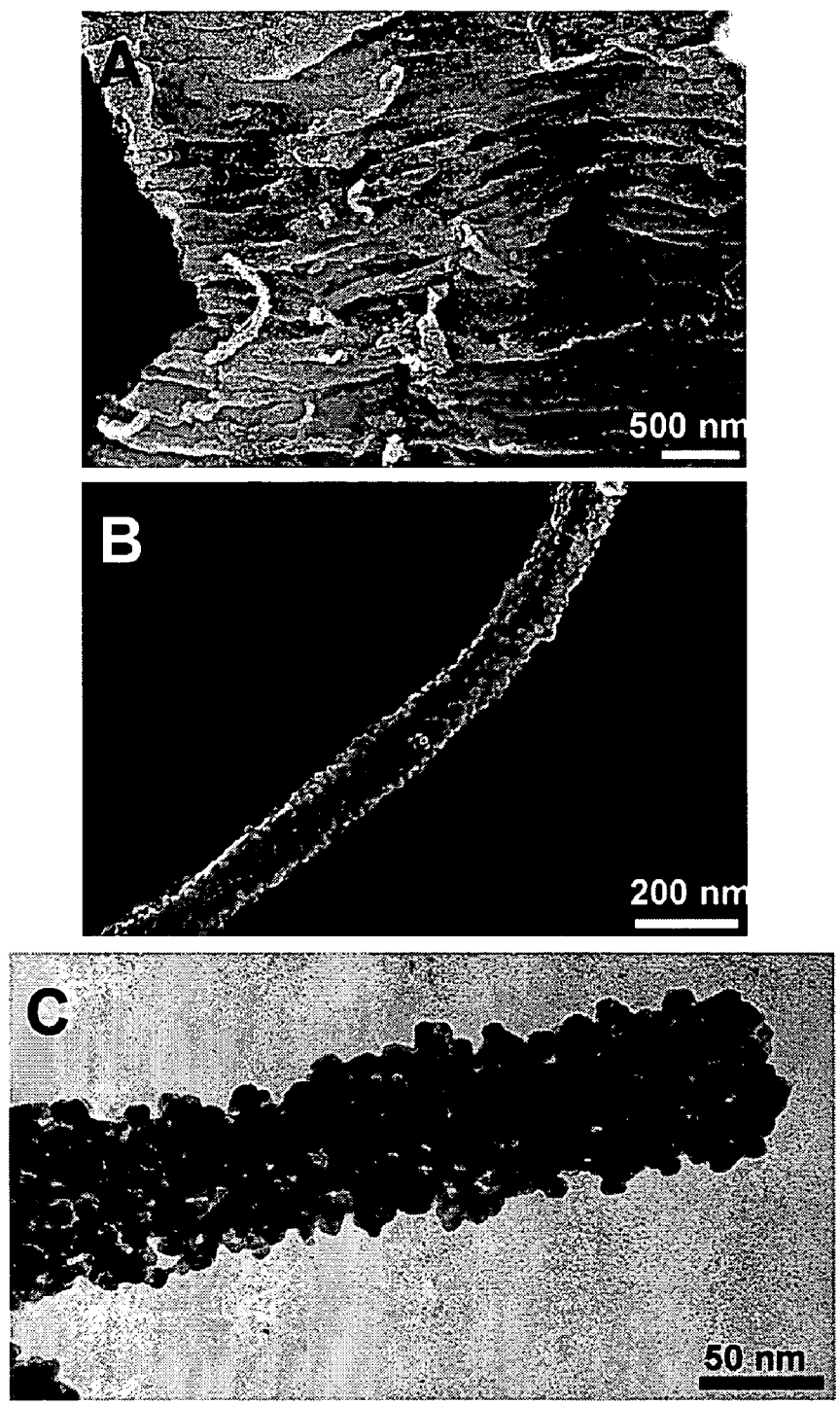
FIG. 16 shows a scanning electron microscope image (A) of the ITO filter paper of Example 12, and a scanning electron microscope image (B) and a transmission electron microscope image (C) of one nanotube material in the ITO filter paper.

A scanning electron microscope image is shown in FIG. 16A. As shown in FIG. 16A, the obtained film had self-supportability, the cellulose fibers were replicated as ITO nanotubes, and the hierarchical structure of the filter paper was reproduced from a nano-size to macro-size level.

Transmission electron microscope images are shown in FIGS. 16B and 16C. The film was composed of uniform crystalline ITO nanoparticles having sizes of less than 10 nm as shown in FIGS. 16B and 16C.

INDUSTRIAL APPLICABILITY

In the method of the present invention for producing the nanotube material, the self-supportable nanotube material can be produced by simple operations under mild conditions. The self-supportable nanotube material can be cut into any shape. It can be expected that the material can be widely used as a breathable coating film for common products because of excellent productivity. Specifically the material can be used for electrical insulation films having hollow structures, dye composite photocatalyst films, highly adsorbing materials, filter members, etc.

The nanotube material of the invention has a shape formed by using the porous substrate as a template, and thereby it can be used in various fields of ultrathin porous sheets, ultrathin porous metal fibers, etc. though it has been difficult to produce them. Particularly, the invention provides an important fundamental technology for next-generation high integration devices. It is expected that the technology be used for producing high-accuracy circuits in the electronics field specifically.

What is claimed is:

1. A method for producing a nanotube material with a porous substrate having an inner wall and an outer surface, comprising at least forming a metal oxide thin film or an organic/metal oxide composite thin film on the inner wall of the porous substrate, removing the porous substrate, and fixing an organic compound and/or a metal nanoparticle to the formed thin film wherein the thin film holds the organic compound and/or metal nanoparticle due to a physical or chemical action.

2. A method for producing a nanotube material with a porous substrate having an inner wall and an outer surface, comprising at least forming a polymer thin film on the inner wall of the porous substrate, forming a metal oxide thin film or an organic/metal oxide composite thin film on the formed polymer thin film, removing the porous substrate, and fixing an organic compound and/or a metal nanoparticle to the formed thin film wherein the thin film holds the organic compound and/or metal nanoparticle due to a physical or chemical action.

3. A method for producing a nanotube material with a porous substrate having an inner wall and an outer surface, comprising at least forming a polymer thin film on the inner wall of the porous substrate, forming a metal oxide thin film or an organic/metal oxide composite thin film on the formed polymer thin film, and removing the porous substrate; and removing the polymer thin film or the polymer thin film and an organic compound contained in the organic/metal oxide composite thin film, simultaneous with or after the step of removing the porous substrate.

4. The method according to claim 3, wherein the step of forming the polymer thin film and/or the step of forming the metal oxide thin film or the organic/metal oxide composite thin film are repeated at least once.

5. The method according to claim 4, wherein the step of forming the polymer thin film and the step of forming the metal oxide thin film or the organic/metal oxide composite thin film are carried out alternately.

6. The method according to claim 3, wherein the porous substrate, the polymer thin film, and/or the organic compound contained in the organic/metal oxide composite thin film are removed by at least one treatment selected from oxygen plasma treatments, ozone oxidation treatments, burning treatments, and dissolution treatments.

7. The method according to claim 6, wherein the porous substrate is removed by a burning or dissolution treatment.

8. The method according to claim 6, wherein the polymer thin film and the organic compound contained in the organic/metal oxide composite thin film are removed by an oxygen plasma treatment.

* * * * *